(12) United States Patent
Tomlinson et al.

(10) Patent No.: US 8,921,690 B2
(45) Date of Patent: Dec. 30, 2014

(54) SOLAR CONCENTRATOR

(75) Inventors: Andy Tomlinson, Melbourn Royston Herts (GB); John-Paul Szczepanik, Melbourn Royston Herts (GB)

(73) Assignee: The Technology Partnership PLC (GB)

( * ) Notice: Subject to any disclaimer, the term of this patent is extended or adjusted under 35 U.S.C. 154(b) by 226 days.

(21) Appl. No.: 13/381,983

(22) PCT Filed: Jul. 1, 2010

(86) PCT No.: PCT/GB2010/001276
§ 371 (c)(1),
(2), (4) Date: Mar. 1, 2012

(87) PCT Pub. No.: WO2011/001151
PCT Pub. Date: Jan. 6, 2011

(65) Prior Publication Data
US 2012/0273025 A1    Nov. 1, 2012

(30) Foreign Application Priority Data
Jul. 2, 2009    (GB) .................................. 0911514.8

(51) Int. Cl.
*H01L 31/052*    (2014.01)
*F24J 2/06*    (2006.01)
*F24J 2/08*    (2006.01)
*F24J 2/54*    (2006.01)

(52) U.S. Cl.
CPC *F24J 2/067* (2013.01); *F24J 2/085* (2013.01); *F24J 2/54* (2013.01); *H01L 31/0522* (2013.01); *Y02E 10/43* (2013.01); *Y02E 10/47* (2013.01); *Y02E 10/52* (2013.01)
USPC .............................. 136/259; 136/246; 438/65

(58) Field of Classification Search
USPC ................................... 136/246, 259
See application file for complete search history.

(56) References Cited

U.S. PATENT DOCUMENTS

| 4,968,355 A | 11/1990 | Johnson |
| 2009/0032102 A1 | 2/2009 | Chen et al. |

FOREIGN PATENT DOCUMENTS

| WO | 2007048114 A2 | 4/2007 |
| WO | 2008012779 A2 | 1/2008 |
| WO | WO 2008/012779 * | 1/2008 |
| WO | 2009063231 A2 | 5/2009 |

OTHER PUBLICATIONS

International Search Report for PCT/GB2010/001276, Completed by the European Patent Office on Oct. 6, 2011, 3 Pages.

* cited by examiner

*Primary Examiner* — Jayne Mershon
(74) *Attorney, Agent, or Firm* — Brooks Kushman P.C.

(57) ABSTRACT

The light concentrator having a primary optical element which has an optical axis and a core comprising a rigid body which is co-linear with the optical axis and configured to support the primary optical element.

14 Claims, 12 Drawing Sheets

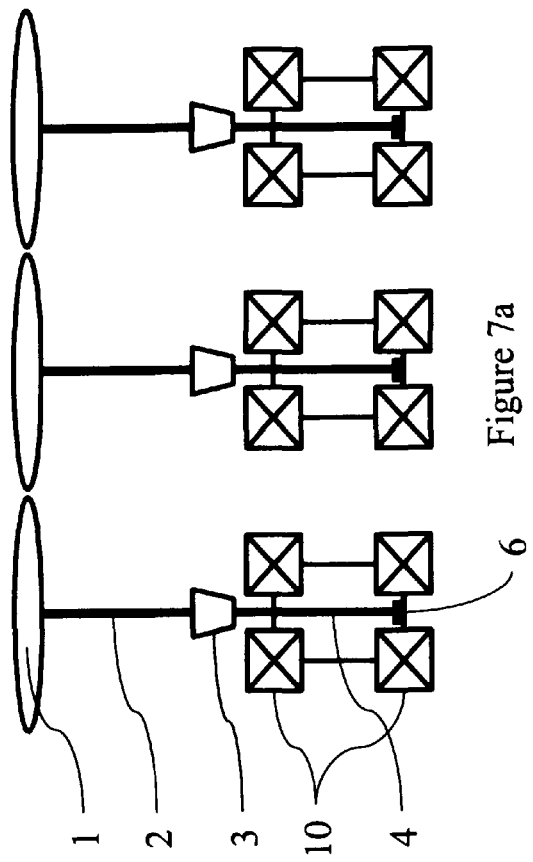
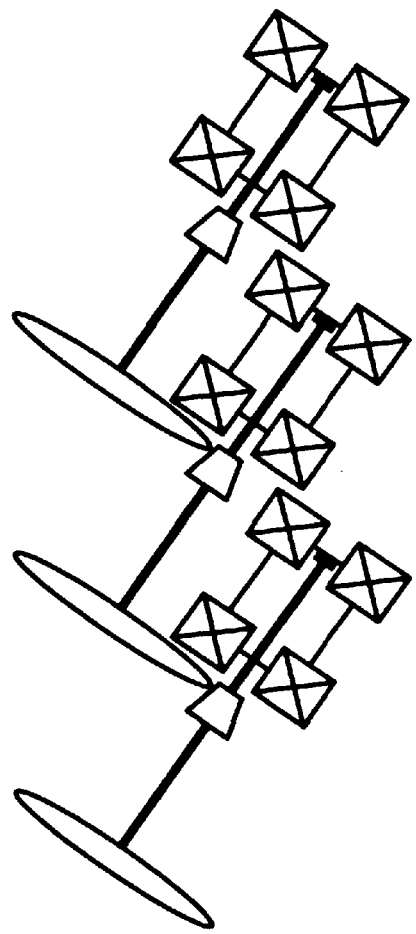
Figure 7a
Figure 7b 1
2
3
4

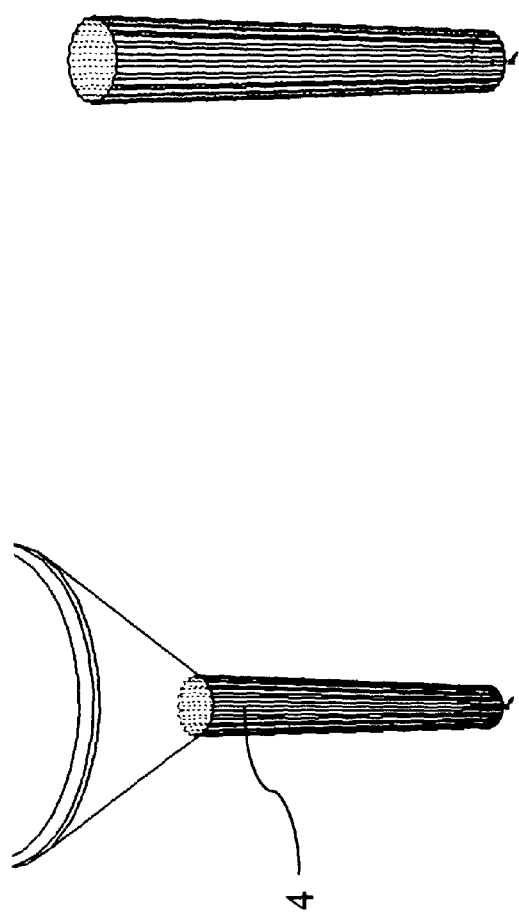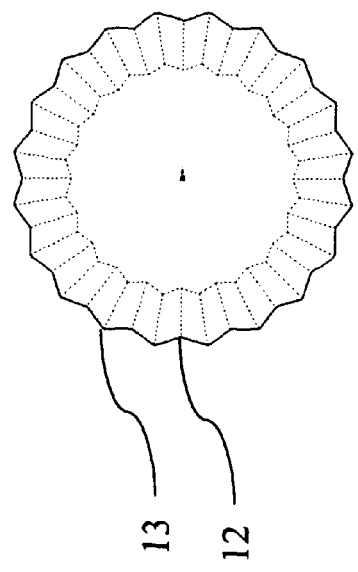
Figure 11a
Figure 11b
Figure 11c

SOLAR CONCENTRATOR

CROSS-REFERENCE TO RELATED APPLICATION

This application is the U.S. national phase of PCT Appln. No. PCT/GB2010/001276 filed Jul. 1, 2010 which claims priority to Great Britain application 0911514.8 filed Jul. 2, 2009, the disclosures of which are incorporated in their entirety by reference herein.

The present invention relates to a solar concentrator for a solar panel.

Concentration systems bring down the costs of electricity production by reducing the amount of expensive photovoltaic material in a solar panel system. Instead of covering a large area with photovoltaic material, low cost optics or lenses are used to focus sunlight onto a smaller area. By this technique the cost per unit of energy harvested is reduced.

So called "high concentration" solar concentrator systems work with sunlight concentration ratios of 500:1 or higher. Furthermore, the light must uniformly illuminate the photovoltaic evenly to ensure maximum efficiency. To achieve this, it is preferred that the optical system rotates to face the sun as it moves across the sky in order to maintain high concentration and uniform illumination.

Due to the cost of making and installing large moving structures, it is attractive to make the overall system stationary; hence it is necessary to create an array of small elements within a fixed framework that individually tilt to track the sun. Each element requires some form of hinges, joints or equivalent to enable it to tilt. It is convenient to place the hinges, joints or equivalent around the perimeter of each element. Examples of such systems are described in U.S. Pat. No. 4,968,355 and WO2009/063231.

Solar concentrator systems focus sunlight, which is collimated within the apparent angular diameter of the sun (approx 0.5 degrees) to a photovoltaic material, normally a Silicon-Germanium and/or III-V semiconductor compound.

In order to achieve high concentration ratios, it is common to use two optical elements, which could be light guides, lenses or mirrors in the system. Incident sunlight is initially focussed by a primary optical element concentrating the optical power. It then travels to a second optical element, which normally encapsulates the photovoltaic material and provides further concentration and optionally homogenisation. Using a second element that encapsulates the photovoltaic enables higher concentration ratios with higher tolerances to angular misalignment to be achieved. The primary and secondary optical elements are normally independent components that are supported relative to each other using other components.

The mechanical system to allow each element to tilt occupies a certain amount of area in the plane of the top half of the tilt stage, therefore obscuring some of the light gathering area in a conventional system. This reduces the amount of energy collected by the system and is therefore disadvantageous. However, this results in arrays of conventional optical systems based on primary and secondary elements that are held in place by a framework around their edges which collide with each other after a certain angular displacement, placing a limit on the maximum angular range over which the concentrator system can track the sun. Our invention aims to solve this problem.

The optical system of the present invention enables collection of light from greater than 95% of the available aperture without collision of elements for tilt angles up to approximately 60 degrees from their central position at which they collect sunlight at the zenith. In addition, the system is cheap to produce due to use of the minimum number of components and the minimum quantity of material.

According to the present invention a light concentrator comprising a central light transmissive core, the core having a light receiving end and a light transmitting end, the light transmitting end being arranged, in use, to be positioned adjacent to a photovoltaic device;

a primary optical element extending from the light receiving end of the core and arranged to concentrate light incident outside of the light receiving end of the core region towards a position displaced axially along the core; and a secondary optical element extending radially from the core and displaced axially from the first optical element and arranged to receive light concentrated by the primary optical element and direct it towards the core.

The component may be made from a transparent optical material, such as glass or PMMA. The core may be in the form of a cylindrical rod, which may be tapered and may have a curved top end face that acts as a lens to concentrate light onto a small region at the bottom end of the core.

There may be an additional axial element extending down from the base of the core. This element may act to homogenise the spatial distribution of light entering from the base of the core. The element may optionally also be tapered such that the cross-sectional area is smaller at the bottom than at the top to provide additional concentration of the light. This axial element is a non-imaging element and directs light by means of total internal reflection of light which confines light within the element. If this element is present, the photovoltaic material at the base of it is preferably optically bonded to the core without an air gap between the base of the core and the photovoltaic.

The primary optical element may be in the form of a conventional lens or may be a lens structure that contains Fresnel lens features. Such a structure provides a similar function to that provided by a conventional lens but has reduced space, weight and material requirements. The perimeter of the primary element may be hexagonal or any other tessellating polygonal configuration to allow for maximal close-packing of concentrator components within an array.

The primary and secondary elements, in combination, act to concentrate light from an annular region surrounding the core at the top of the component down to the base of the core. To prevent some of this light interacting with the segment of the core element between the primary and secondary elements, the shape of the primary element is preferably formed by defining a lens cross-section and rotating this cross-section about an axis parallel to, but displaced from the lens axis.

The homogeniser element may be a simple polygon with either an odd, or an even, number of points. For example, the homogeniser may be a square, pentagon or hexagon. One preferred embodiment of the homogeniser element employs a 'star shaped' cross section defined by an even number, N, of points positioned at equal angles about the centre point whereby the distance of the odd-numbered point from the centre is r1 and the distance of the even-numbered point from the centre is r2, and where r1 and r2 are not equal. In an example embodiment, N=40, r1=1.5 mm and r2=1.6 mm. Optionally, this cross section may be combined with a taper, such that r1 and r2 vary in proportion along the length of the element.

The main advantage of the invention is that it is self supporting and hence does not require an external framework which would reduce optical throughput.

It allows the elements to be tilted away from the zenith (in both axis) and not collide with adjacent elements in a densely packed array.

It uses substantially less material than a single solid element thereby achieving high transmission and low manufacturing cost.

An example embodiment has demonstrated a high concentration ratio combined with very good spatial uniformity at the photovoltaic, high throughput, and good tolerance to misalignment to the Sun's position.

Furthermore, according to the present invention there is provided a light concentrator comprising: a primary optical element which has an optical axis; and a core comprising a rigid body which is substantially co-linear with the optical axis and configured to support the primary optical element.

The primary optical element may have Fresnel steps on one or more surface. The primary optical element may be a non-imaging element.

The core may be light transmissive or it may be non-light transmissive. In the case where the core is light transmissive, the core has a light transmitting end that is arranged, in use, to transmit light to a photovoltaic device. Furthermore, if the core is light transmissive, the core may be integrally moulded with the primary optical element.

The light concentrator may further comprise a photovoltaic device. The light concentrator may further comprising a secondary optical element arranged to receive light concentrated by the primary optical element and direct that light towards the photovoltaic device. The secondary optical element may be arranged to additionally received light directly. The secondary optical element may include a homogeniser and/or a concentrating lens.

A plurality of light concentrators according to the present invention may be combined to form a light concentrator system wherein each light concentrator is provided with a support structure and rotation system and wherein the support structures of the light concentrators are arranged in a single plane.

The cores of the light concentrators may be configured to support the primary optical elements closer to the light source than the plane of the support structures. The primary optical elements of the light concentrators may tessellate. The secondary optical element may be provided in the plane of the support structures.

An example of the present invention will now be described with reference to the accompanying drawings in which:

FIG. 7a is a schematic diagram of a side cross-sectional view showing an example of a system according to the present invention;

FIG. 7b is a schematic diagram of a side cross-sectional view showing the arrangement of FIG. 7a when rotated to maximum extent;

FIG. 10d shows the detail from FIG. 10b superposed over the detail of FIG. 10a;

FIGS. 11a and 11b are isometric views of a homogeniser provided as part of a concentrator element according to the present invention;

FIG. 11c is top cross-sectional view of the homogeniser shown in FIGS. 11a and 11b.

Figure 1A:
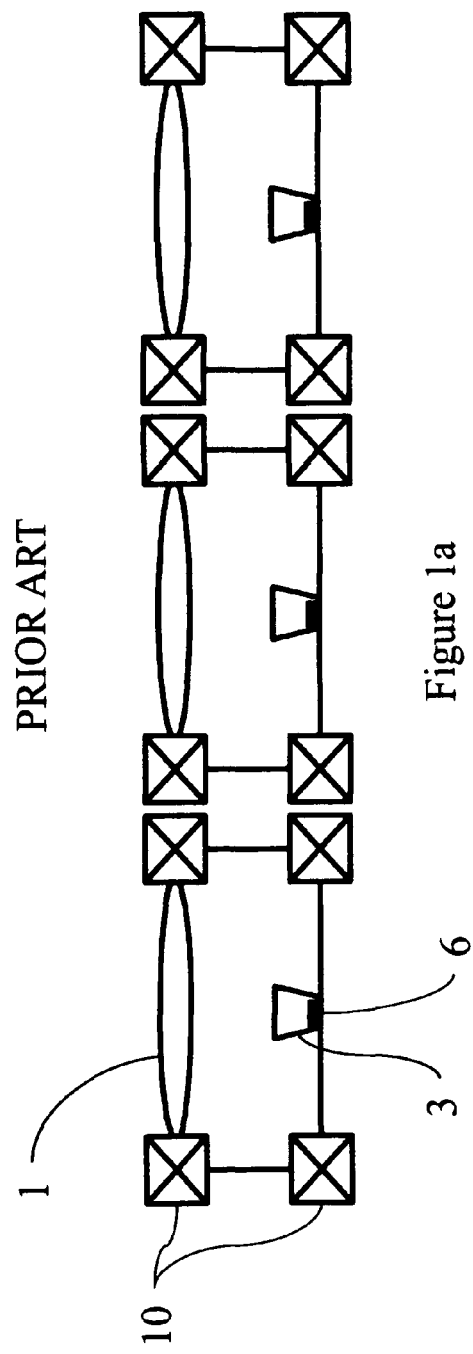
FIG. 1a is a schematic diagram of a side cross-sectional view of an example of a prior art solar concentrator.
Figure 1B:
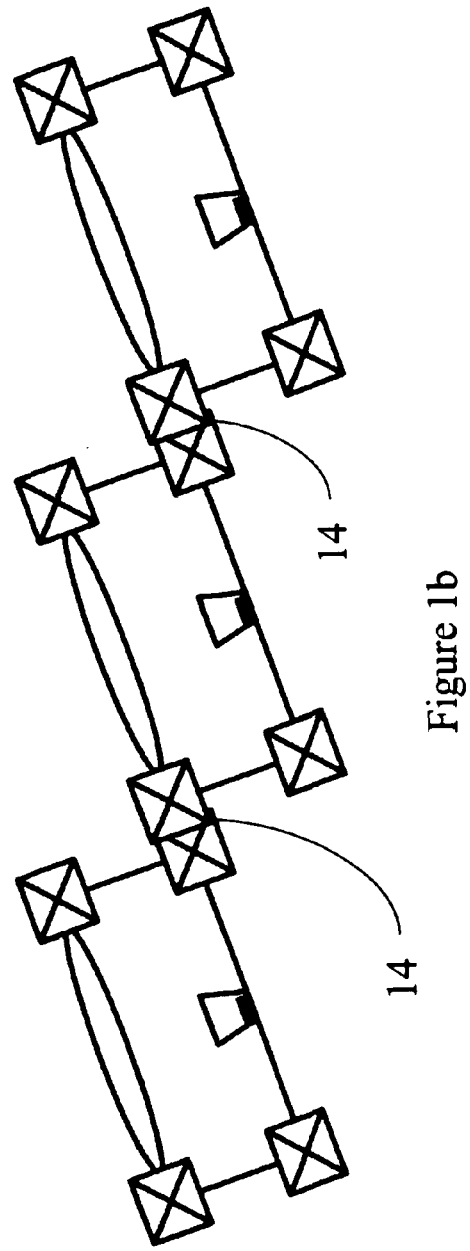
FIG. 1b is a schematic diagram of a side cross-sectional view showing what happens when each of the elements within the arrangement of FIG. 1a are rotated to track the sun.

A schematic diagram of a prior art solar concentrator system is shown in FIGS. 1a and 1b comprising a matrix of primary optical elements 1. Each primary optical element 1 is supported by a support structure and rotation mechanism 10. Each support structure and rotation mechanism 10 comprises an upper support 12 and lower support 13. The upper support 12 is annular and extends around the perimeter of the primary optical element. Below the primary optical element 1, in the same plane as the lower support 13 is a secondary optical element 3 and photovoltaic material 6. The system suffers from poor collection area efficiency because, as viewed from above, the support structure 10 occupies a significant proportion of the available collection area meaning that the device can only collect a fraction of the incident light.

In FIG. 1b each of the elements is rotated to track the sun, as is necessary in a concentrator device. The figure shows that, after a relatively small angle of rotation, the upper support 12 of one concentrator touches the lower support 13 of the adjacent concentrator, thus limiting the rotation of the concentrator. One approach to overcoming this problem has been to further space the elements out but this results in a further reduction in the overall collection efficiency of the device.

Figure 2A:
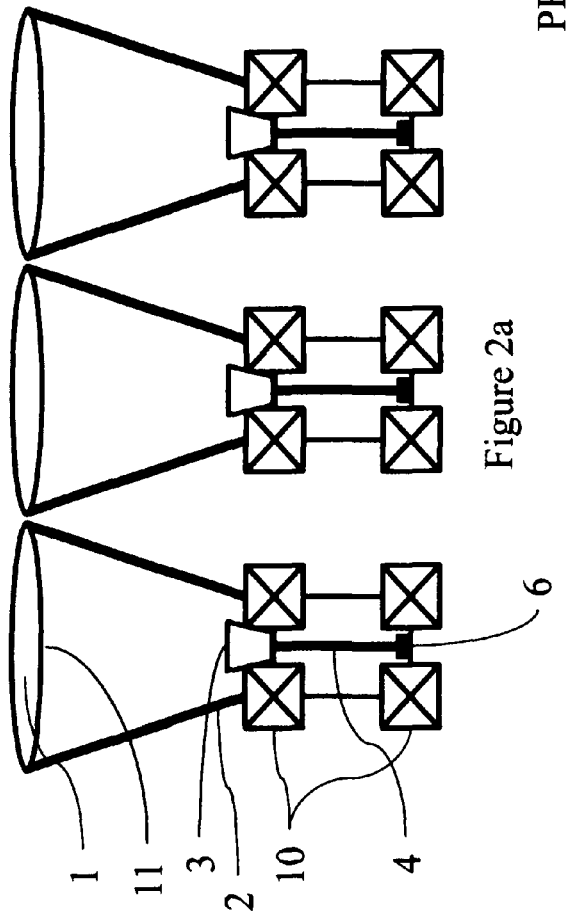
FIG. 2a is a schematic diagram of a side cross-sectional view illustrating an example of a system according to the present invention.
Figure 2B:
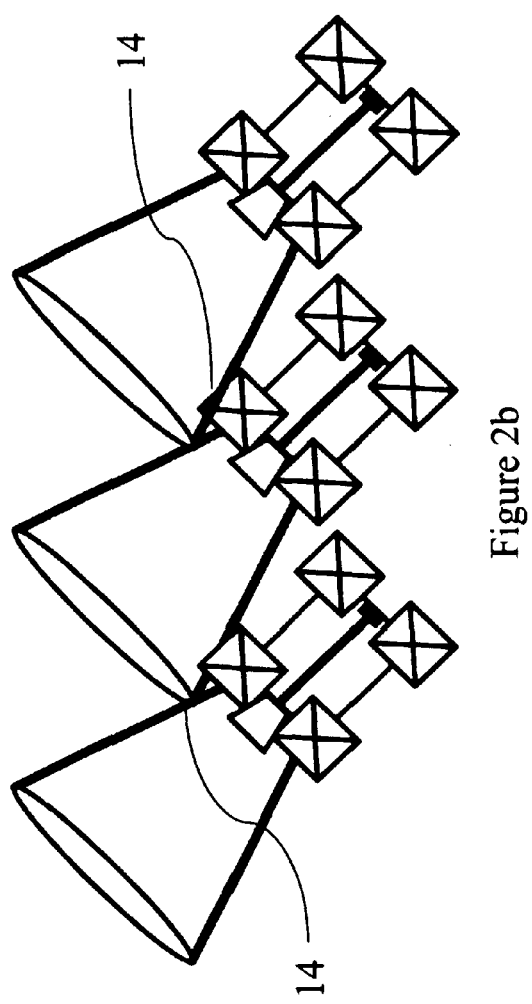
FIG. 2b is a schematic diagram of a side cross-sectional view showing the arrangement of FIG. 2a when rotated to maximum extent.

Referring to FIGS. 2a and 2b, an array of concentrators is shown in which each primary optical element 1 has been raised above the plane of the support structure and rotating mechanism 10. Each support structure and rotating mechanism 10 is secured to a surface, such as a roof, on which the array is supported. The primary optical element 1 is supported by a core 2 around its perimeter 11. The approach of lifting the primary optical element out of the plane of the support structure and rotating mechanism 10, has two effects; the first is that the primary optical element 1 can be increased in size comparative to the system shown in FIGS. 1a and 1b in which the primary optical element is in the same plane as the support mechanism. In the example shown in FIGS. 2a and 2b, the primary optical elements provide increased the collection efficiency in comparison with the system shown in FIGS. 1a and 1b. The second effect is that the support structure and rotating mechanism 10 can be reduced in size (in the radial direction) and this extra space between the concentrators enables them to rotate further before clashing. As can be seen from FIG. 2b the angular deviation possible from orthogonal to the plane of the support structures is considerably greater than that achievable with a system similar to that illustrated in FIGS. 1a and 1b.

The present invention has been devised to address the above-illustrated problems with existing solar concentrator systems. In the examples of the present invention described below, the same reference characters are used to describe features that are the same.

Figure 3:
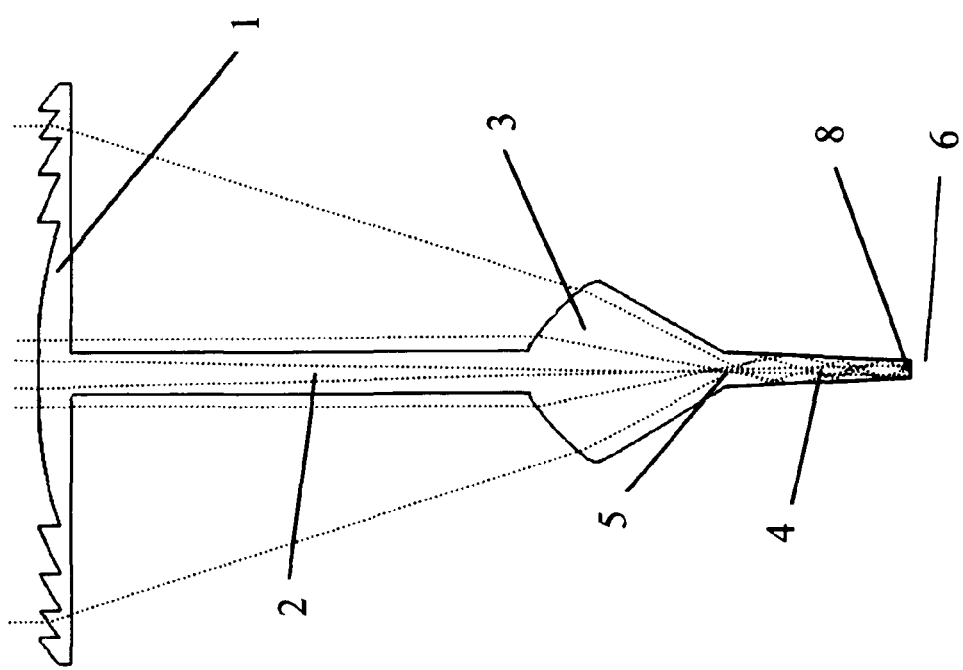
FIG. 3 is a side cross-sectional view of a concentrator according to the present invention.
Figure 4:
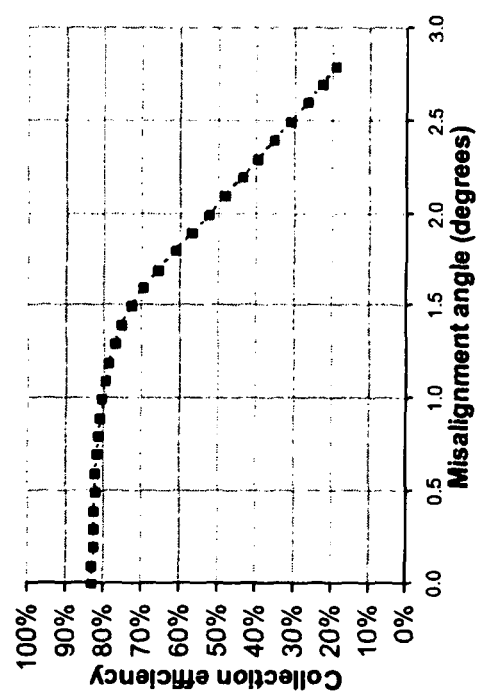
FIG. 4 is a graph showing the collection efficiency of the example of the invention shown in FIG. 2.

A first example of a concentrator according to the present invention is shown in FIG. 3. The concentrator includes a primary optical element 1, a secondary optical element 3 and a core 2 linking the primary to the secondary optical element. Light enters the concentrator through the primary optical element 1 and the light is then transmitted to the secondary optical element 3 either directly or via the core 2. The primary optical element 1 provides the first level of light concentration. The primary optical element 1 is supported by a central core 2, which is light transmissive. At the base 5 of the core 2, the light enters a homogeniser 4. The homogeniser 4 directs the light, through total internal reflection, to the photovoltaic material 6.

In alternative embodiments of the present invention, not shown in the accompanying drawings, the functions of the secondary optical element 3 and the homogenises 4 may be performed by a single homogenising secondary component, which could be for example a simple truncated prism.

Figure 5:
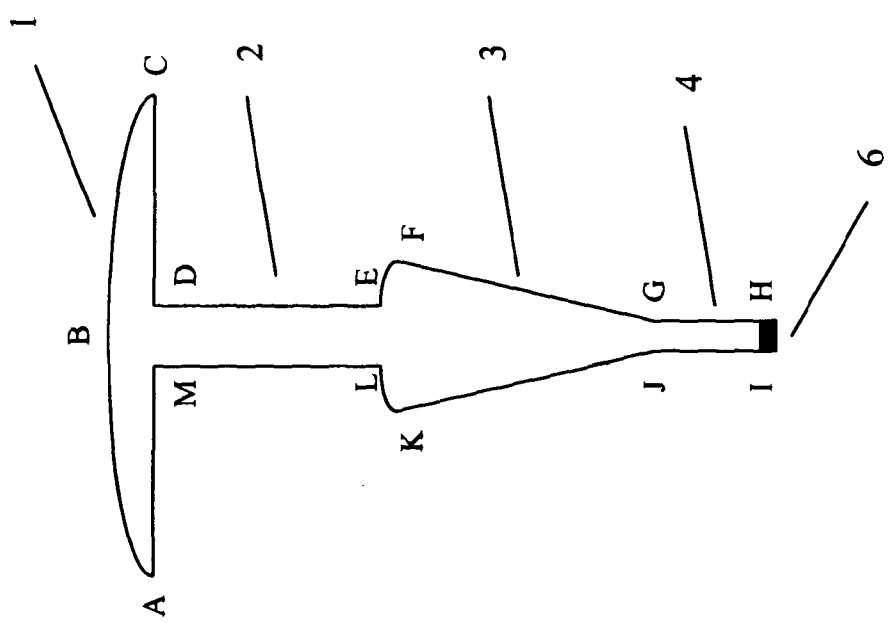
FIG. 5 is a schematic diagram showing a second example concentrator according to the present invention.

With reference to FIG. 5, the general design of a concentrator element according to the present invention is as follows. Optical surface ABC is the front surface of the primary optical element 1.

Light incident on this surface close to point B, will pass between points M and D through the core 2 of the optical element. Light that passes through surface ABC further out radially, will pass through the surrounding zones AM (and CD via rotational symmetry), through the air and re-enter the optical material via surface KL (and EF). This Fresnel type lens could have the Fresnel steps on the entrance face of the primary optical element 1, as shown in FIG. 3, and/or on the exit face of the primary optical element 1, i.e. the face adjacent the support structure. The provision of a primary optical element with Fresnel steps on the exit face, is advantageous over the provision of Fresnel steps in the entrance face as the entrance face is typically upwardly facing and therefore capable of collecting dirt as a result of condensation.

Figure 6:
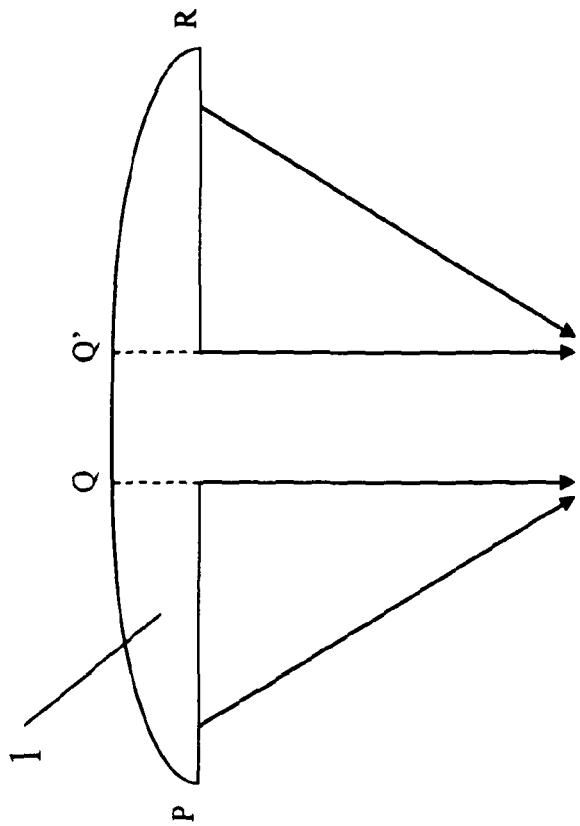
FIG. 6 is a schematic diagram showing the light receiving surface of an example of the present invention.
Figure 6:
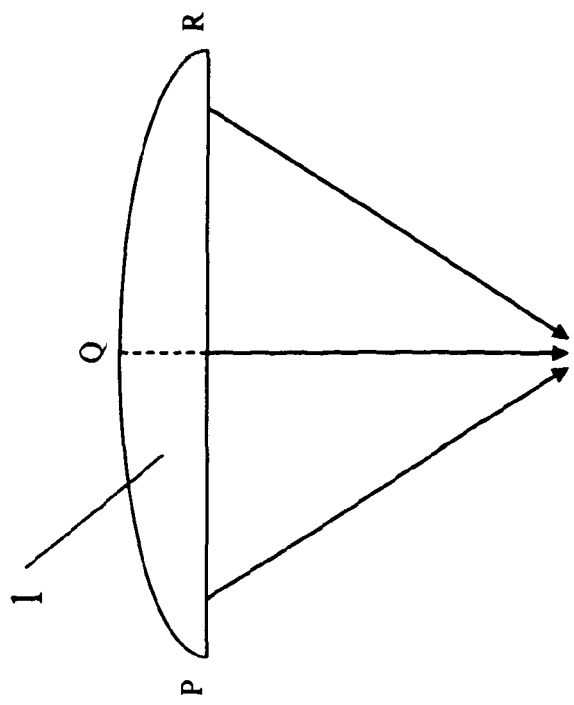

In the example shown in FIG. 6, the primary lens is divided into zones P-Q (also Q'-R) and Q-Q'. Light incident on zone P-Q is directed along paths outside of the core. Light incident on Q-Q' is directed down the core. As such, the curvatures of surfaces in the different zones will be different and there may be a discontinuity in the surface where the zones meet. Within each zone their may be other discontinuities especially if Fresnel lens-like structures are used.

The dashed lines in FIG. 3 show examples of the paths of light through the system. Depending on the nature and focal length of the lenses used the light may or may not reach a focal point which may be before, at or after the entrance aperture to the second optical element.

A possible scheme to design surface ABC is to take a conventional lens profile, to move the same height versus radius function out to a wider radius, and to fill in the gap with a design appropriate to guide light down the core 2 area, as depicted in FIG. 6. This will produce a ring focus rather than a spot focus from the primary optical element 1. This is an example of a non-imaging optical configuration that may be used in conjunction with the present invention. Because the invention does not require the formation of an image, the primary optical element can be any lens configuration provided that it enables light to be concentrated into the secondary optical element even if rays are reordered by the optical structure and a single image is not formed.

Figure 8:
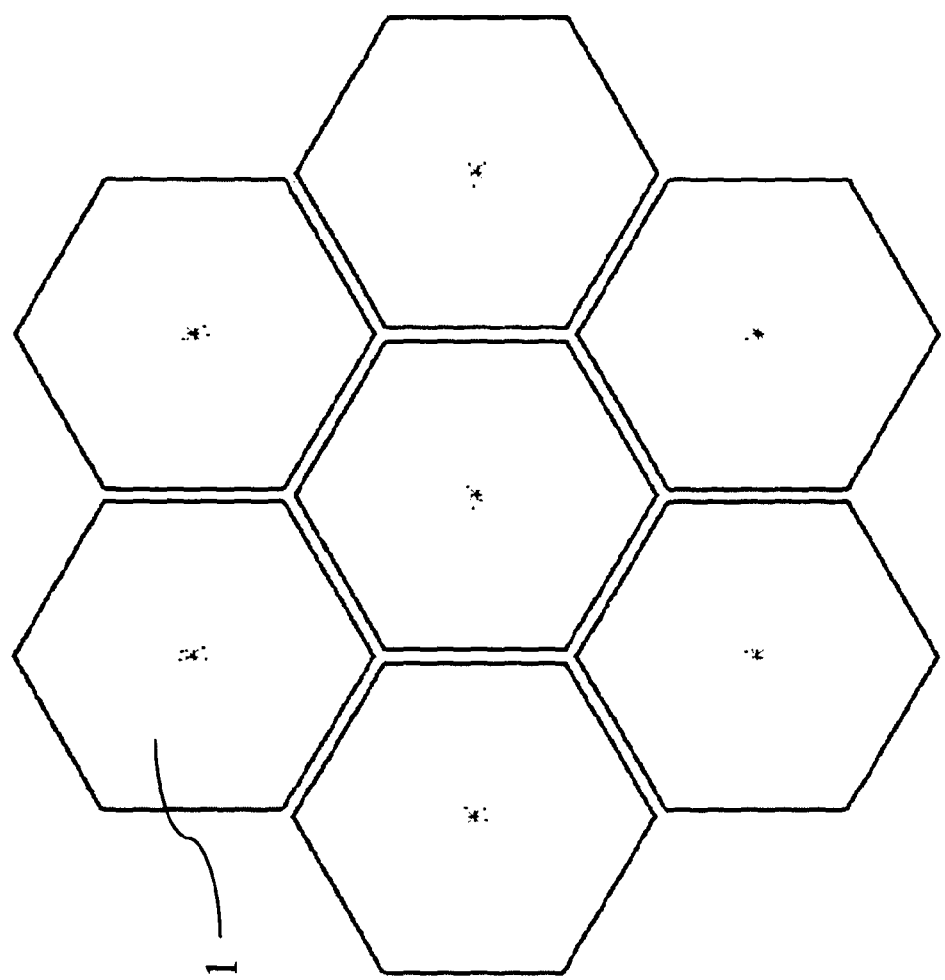
FIG. 8 is a top view of a system according to the present invention.
Figure 9B:
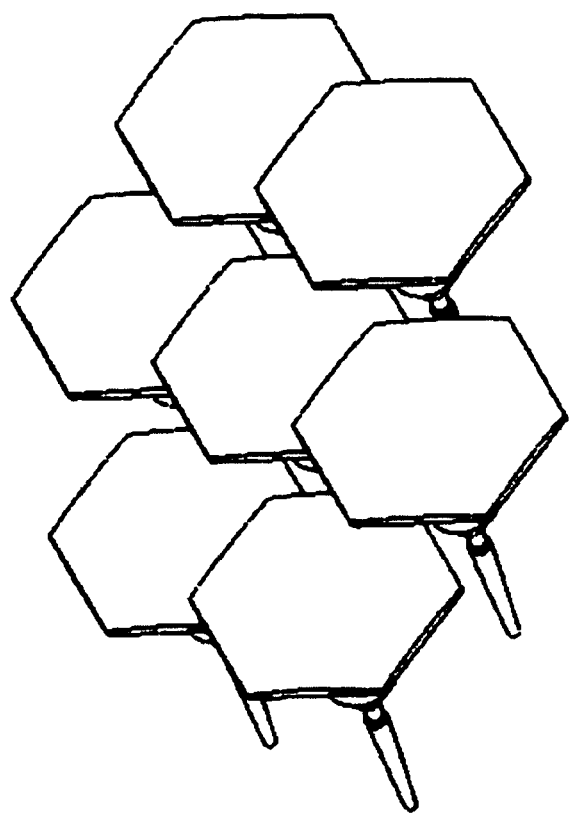
FIGS. 9a and 9b are isometric views of the system shown in FIG. 8.
Figure 9A:
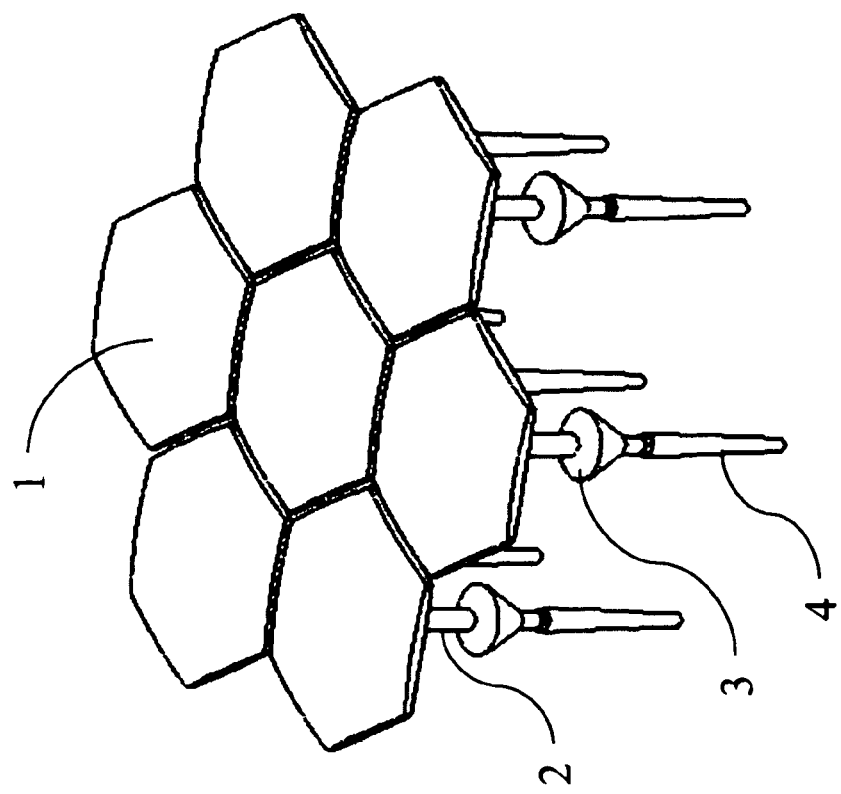
Figure 10A:
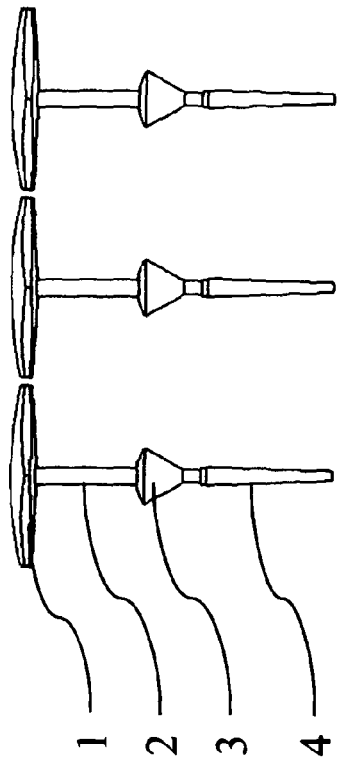
FIGS. 10a, 10b and 10c are side cross-sectional views of the system shown in FIG. 8.
Figure 10C:
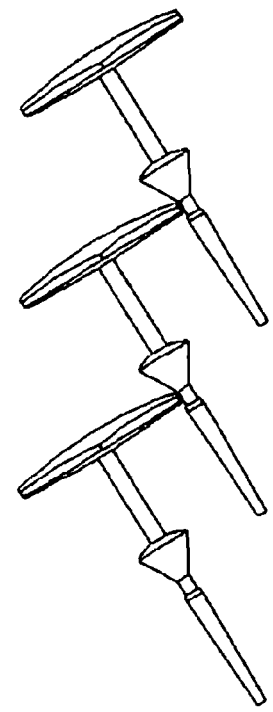
Figure 10B:
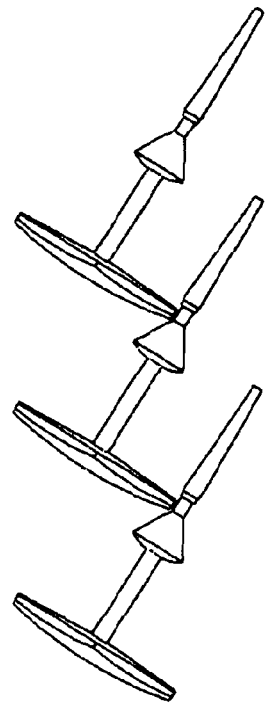
Figure 10D:
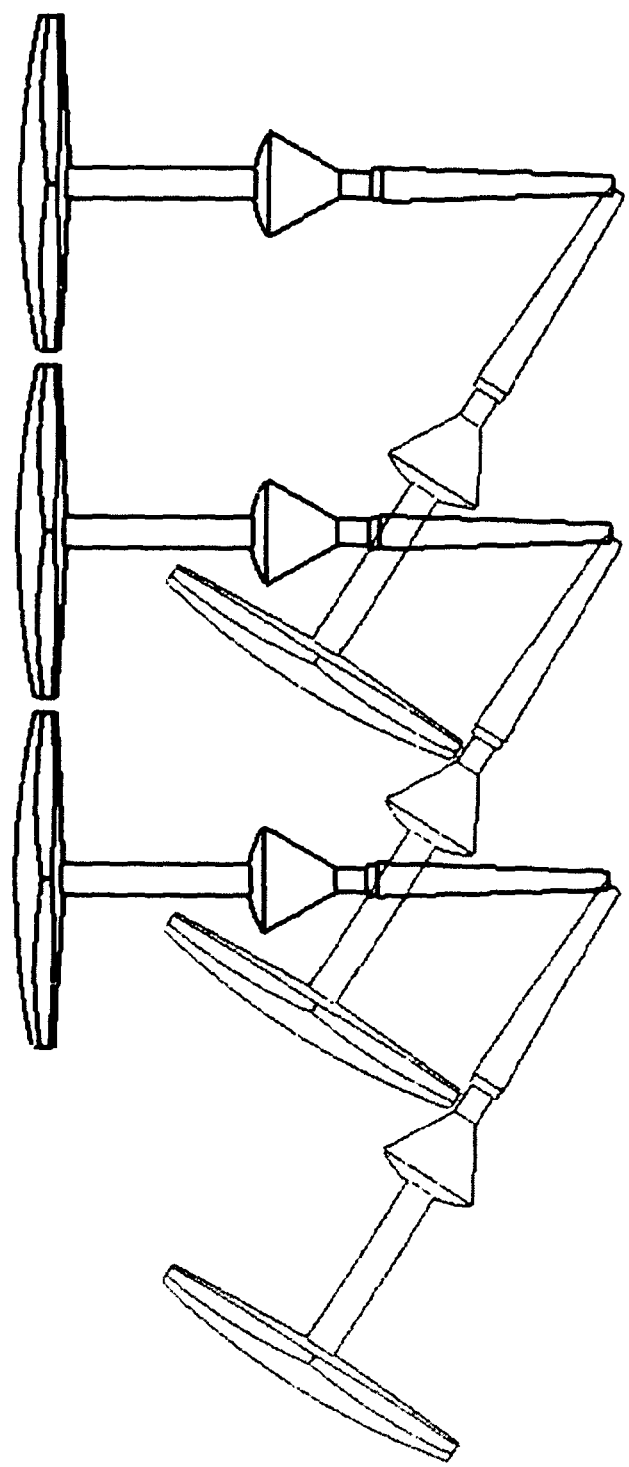

One example of the shape of the primary optical element including surface ABC when viewed from above is shown in FIGS. 8 and 9. Although the example in FIGS. 8 and 9 shows hexagonal tessellating pattern the primary optical elements may alternatively be square or any other tessellating geometry, allowing adjacent elements to be close packed. The shape of the homogeniser 4, including the surfaces FG or KJ is selected to enable the light to be transmitted towards the photovoltaic material 6, typically by total internal reflection. In the illustrated configurations light would not be incident on these surfaces.

Surface AM (CD) could be curved, and possibly a Fresnel structure. Surface LM (DE) could be curved, tapered, and in the other dimension, circular or non-circular.

The focus from the primary optical element 1 may be above or below surface KL (EF). In order to have the light focused before KL a shorter focal length lens will be used. Such lenses typically have worse overall efficiency due to higher surface reflection losses. Conversely, a longer focal length lens, which will result in the light being focussed after KL, will have an improved overall efficiency.

Surface IJ (GH) is preferably non-circular as shown in FIGS. 11a and 11b to create a homogenising effect, so the light intensity at the exit aperture HI is more uniform.

Referring to FIGS. 7a and 7b, the primary optical element 1 is supported by a central core 2. FIG. 7b shows that with the central core each element is now able to rotate further than before to an angle approximately equal to 60 degrees. The embodiment according to the present invention therefore has a much greater collection efficiency and also allows each element to rotate to a greater angle, hence increasing the total amount of energy collected by the concentrator. The core may be light transmissive or it may be non-transmissive. If the core is non-transmissive then the range of materials from which it can be formed is increased. The material of the core may therefore be chosen to optimise the supporting function, i.e. a robust material may be chosen such that the diameter of the core is minimised, thereby minimising the amount of light that is blocked from being transmitted to the photovoltaic material 6.

If the core is transmissive, then it may be formed integrally with the lens, thereby minimising the number of piece part required to form the concentrator. For example, if the lens is a Fresnel lens as shown in FIG. 3, then the core can be a 3-4 mm diameter cylinder formed integrally with the lens which has a diameter of 40 mm.

In the example illustrated in FIGS. 7a and 7b, the secondary optical element 3 is provided substantially in the plane of the support structure and rotating mechanism 10. However, the position of the secondary optical element 3 is a compromise. The longer the focal length of the primary and therefore the further between the primary and secondary optical element, the better the optical efficiency of the concentrator. This would suggest that the secondary optical element would be provided in the plane of the support structure and rotating mechanism 10 or even recessed below that plane. Conversely, in order to maximise efficiency of the system as a whole, all of the light from the primary optical element must be captured by the secondary optical element. This may not be possible if the secondary optical element is sufficiently recessed within the support structure and rotating mechanism 10 that the path of some of the light is blocked by the support structure and rotating mechanism.

FIGS. 8 to 10 show various views of the embodiment according to the present invention and how it enables the element to be closely packed and still allows the rotation of each element without clashing.

Although, in the illustrated examples, the photovoltaic material is positioned adjacent the transmitting end of the core, or lower surface of the homogeniser 4, it will be understood that the photovoltaic material 6 may be situated elsewhere and further means may be provided to transmit the light from the homogeniser to the photovoltaic material. Examples of such means include fibre optics, mirrors, additional optical lenses or light transmissive gels.

The invention claimed is:

1. A light concentrator comprising:
   a primary optical element which has an optical axis;
   a core comprising a rigid body which is substantially co-linear with the optical axis and configured to support the primary optical element; and
   a secondary optical element arranged to receive light concentrated by the primary optical element and direct that light towards a photovoltaic device;
   wherein the secondary optical element includes a homogenizer and a concentrating lens.

2. The light concentrator according to claim 1, wherein the core is the sole support for the primary optical element.

3. The light concentrator according to claim 2, wherein the primary optical element has Fresnel steps on one or more surface.

4. The light concentrator according to claim 1, wherein the primary optical element is a non-imaging element.

5. The light concentrator according to claim 1, wherein the core is light transmissive.

6. The light concentrator according to claim 5, wherein the core is integrally moulded with the primary optical element.

7. The light concentrator according to claim 5, wherein the core has a light transmitting end that is arranged, in use, to transmit light to a photovoltaic device.

8. The light concentrator according to claim 1, further comprising a photovoltaic device.

9. The light concentrator according to claim 1, wherein the secondary optical element is arranged to additionally received light directly.

10. A light concentrator system comprising a plurality of light concentrators according to claim 1, wherein each light concentrator is provided with a support structure and rotation system and wherein the support structures of the light concentrators are arranged in a single plane.

11. The light concentrator system according to claim 10, wherein the cores of the light concentrators support the primary optical elements closer to the light source than the plane of the support structures.

12. The light concentrator system according to claim 10, wherein the primary optical elements of the light concentrators tessellate.

13. The light concentrator system according to claim 10, wherein the secondary optical element is provided in the plane of the support structures.

14. A light concentrator comprising a central light transmissive core, the core having a light receiving end and a light transmitting end, the light transmitting end being arranged, in use, to be positioned adjacent to a photovoltaic device;
   a primary optical element extending gradually from the light receiving end of the core and arranged to concentrate light incident outside of the light receiving end of the core region towards a position displaced axially along the core;
   a secondary optical element extending radially from the core and displaced axially from the first optical element and arranged to receive light concentrated by the primary optical element and direct it towards the core; and
   a homogenizer which receives light from the secondary optic element and directs light to the photovoltaic device.

* * * * *